United States Patent
Akahori

(10) Patent No.: US 7,099,639 B2
(45) Date of Patent: Aug. 29, 2006

(54) AUTOMATIC FREQUENCY CONTROL APPARATUS FOR DETERMINING LOOP GAIN CONSTANT BASED ON ABSOLUTE PHASE ERROR

(75) Inventor: Hiroji Akahori, Tokyo (JP)

(73) Assignee: Oki Electric Industry Co,. LTD, Tokyo (JP)

( * ) Notice: Subject to any disclaimer, the term of this patent is extended or adjusted under 35 U.S.C. 154(b) by 337 days.

(21) Appl. No.: 10/373,081

(22) Filed: Feb. 26, 2003

(65) Prior Publication Data

US 2003/0232606 A1    Dec. 18, 2003

(30) Foreign Application Priority Data

Jun. 14, 2002    (JP) ............................. 2002-173760

(51) Int. Cl.
*H04B 1/18* (2006.01)

(52) U.S. Cl. ............................. 455/182.2; 455/180.3; 455/260; 331/175; 331/1 A; 331/177 R

(58) Field of Classification Search ................ 455/123, 455/119, 424, 425, 561, 550.1, 575.1, 456.5, 455/456.6, 42, 67.16, 76, 71, 164.1, 164.2, 455/165.1, 136, 139, 147, 180.3, 182.1–182.2, 455/192, 257–265, 318, 260; 370/210, 203, 370/305, 503, 516, 336, 338, 208; 375/316, 375/324, 329, 330, 340, 341, 344.355, 325–333, 375/376, 368, 326, 350, 354, 375, 373, 339, 375/219, 371; 329/304, 345, 325; 331/25, 331/16, 17, 18, 2, 175, 179, 1 A, 177 R, 331/34, 185

See application file for complete search history.

(56) References Cited

U.S. PATENT DOCUMENTS

| | | | | |
|---|---|---|---|---|
| 3,911,219 | A | * | 10/1975 | Mullins ...................... 375/330 |
| 5,200,712 | A | * | 4/1993 | Srivastava .................. 331/1 A |
| 5,764,102 | A | * | 6/1998 | Cochran et al. ............ 329/304 |
| 6,097,768 | A | * | 8/2000 | Janesch et al. ............. 375/330 |
| 6,341,123 | B1 | * | 1/2002 | Tsujishita et al. .......... 370/210 |
| 6,633,616 | B1 | * | 10/2003 | Crawford .................... 375/326 |
| 6,683,921 | B1 | * | 1/2004 | Shiraishi et al. ............ 375/331 |
| 2003/0161235 | A1 | * | 8/2003 | Baba ....................... 369/47.28 |
| 2003/0202496 | A1 | * | 10/2003 | Kluge et al. ................ 370/338 |

* cited by examiner

*Primary Examiner*—Edward F. Urban
*Assistant Examiner*—Charles Chow
(74) *Attorney, Agent, or Firm*—Rabin & Berdo P.C.

(57) ABSTRACT

An automatic frequency control apparatus includes a mixer, a phase error detector, an absolute value converter, a determination unit, a multiplier and an oscillator. The mixer performs a frequency alternation of a phase modulated signal received thereto based on a frequency of a carrier signal. The phase error detector generates a carrier phase error. The absolute value converter calculates an absolute value of the phase error. The determination compares the absolute value with predetermined threshold values and generates loop gain based on the comparison. The multiplier generates a correction value based on the phase error and the loop gain. The oscillator generates the carrier signal based on the correction value.

11 Claims, 5 Drawing Sheets

AUTOMATIC FREQUENCY CONTROL APPARATUS FOR DETERMINING LOOP GAIN CONSTANT BASED ON ABSOLUTE PHASE ERROR

BACKGROUND OF THE INVENTION

The present invention relates to an automatic frequency control apparatus, and in particular to an automatic control apparatus, provided for a demodulator in a radio communication apparatus, that can employ the carrier phase error of a received signal, obtained through digital phase modulation or digital frequency modulation, to quickly and stably converge, at a desired frequency, the frequency of a carrier that is locally oscillated.

Various techniques for reducing power consumption are employed for demodulation of a radio communication apparatus used for a radio communication system. One of the techniques involves the use of an automatic frequency control (AFC: Automatic Frequency Control) apparatus that detects the phase of a received signal obtained through digital phase modulation or digital frequency modulation, and that employs the carrier phase error of the received signal to converge, at a desired frequency, the frequency of a carrier that is processed by a local oscillator.

In a conventional automatic frequency control apparatus, along a time axis a gain unit determines a loop gain to be multiplied by phase error data, and when the loop gain is high, a frequency deviation to be corrected is increased and the frequency quickly follows up a desired frequency, while the operating stabilization is low. When the loop gain is low, the frequency deviation to be corrected is reduced and the frequency slowly follows up a desired frequency, while stabilization of the operation is increased.

Since regardless of the magnitude of the phase error, the conventional automatic frequency control apparatus varies, along the time axis, the loop gain to be multiplied by the phase error data, it is difficult to obtain a correction value that is consonant with an actual change in the phase error.

That is, in accordance with a time-transient instruction from a timer or a controller such as a DSP or a CPU, at the initial synchronization time, whereat it is estimated that the phase error is the greatest, the gain unit either increases the loop gain that is to be multiplied, or reduces the loop gain after a predetermined period of time has elapsed and a range is reached wherein the frequency is stabilized. Therefore, since the high loop gain is multiplied even through the phase error at the initial synchronization time is small, an extended period of time is required before the stable frequency range is reached. Further, since in the stable range, following the elapse of the predetermined time, a low loop gain is multiplied, even when the phase error is increased due to an anticipated change in the transmission condition, an extended period of time is required before the frequency can again be converged at the desired frequency.

Further, since the conventional automatic frequency control apparatus performs the loop process to correct the frequency of the carrier for which local oscillation is provided, phase error vibration may occur due to the loop delay.

That is, for a signal for which the phase is adjusted by a mixer, a loop delay occurs that continues until the correction of the phase error is again reflected to the mixer, and depending on the value of the initial phase error, convergence of the frequency occurs while the phase error is vibrated while being repetitively increased and decreased, when the loop gain to be multiplied is equal to or greater than a specific value. Because of the vibration, the convergence time is extended considerably, and even when the loop gain is increased until it is equal to or greater than a specific value, it is not possible to reduce the convergence time.

SUMMARY OF THE INVENTION

It is, therefore, an object of the present invention to provide an automatic frequency controller that varies the magnitude of a phase error of a received signal obtained by frequency conversion, or of a loop gain that is to be multiplied by phase error data in accordance with a phase angle difference, so that the received frequency error can be quickly and stably corrected in accordance with a change in the transmission conditions encountered during the demodulation of a received signal.

An automatic frequency control apparatus of the present invention includes a mixer, a phase error detector, an absolute value converter, a determination unit, a multiplier and an oscillator. The mixer performs a frequency alternation of a phase modulated signal received thereto based on a frequency of a carrier signal. The phase error detector generates a carrier phase error. The absolute value converter calculates an absolute value of the phase error. The determination compares the absolute value with predetermined threshold values and generates loop gain based on the comparison. The multiplier generates a correction value based on the phase error and the loop gain. The oscillator generates the carrier signal based on the correction value.

DETAILED DESCRIPTION OF THE PREFERRED EMBODIMENTS

An automatic frequency control apparatus according to a first embodiment of the present invention will now be described in detail while referring to FIGS. 1 and 2.

According to the first embodiment, the present invention is applied for an automatic frequency control apparatus for altering the frequencies of received, digital phase modulated signals, for adjusting, in accordance with phase errors, loop gains that are to be multiplied, and for correcting frequency errors for carrier waves that are to be oscillated locally.

Figure 1:
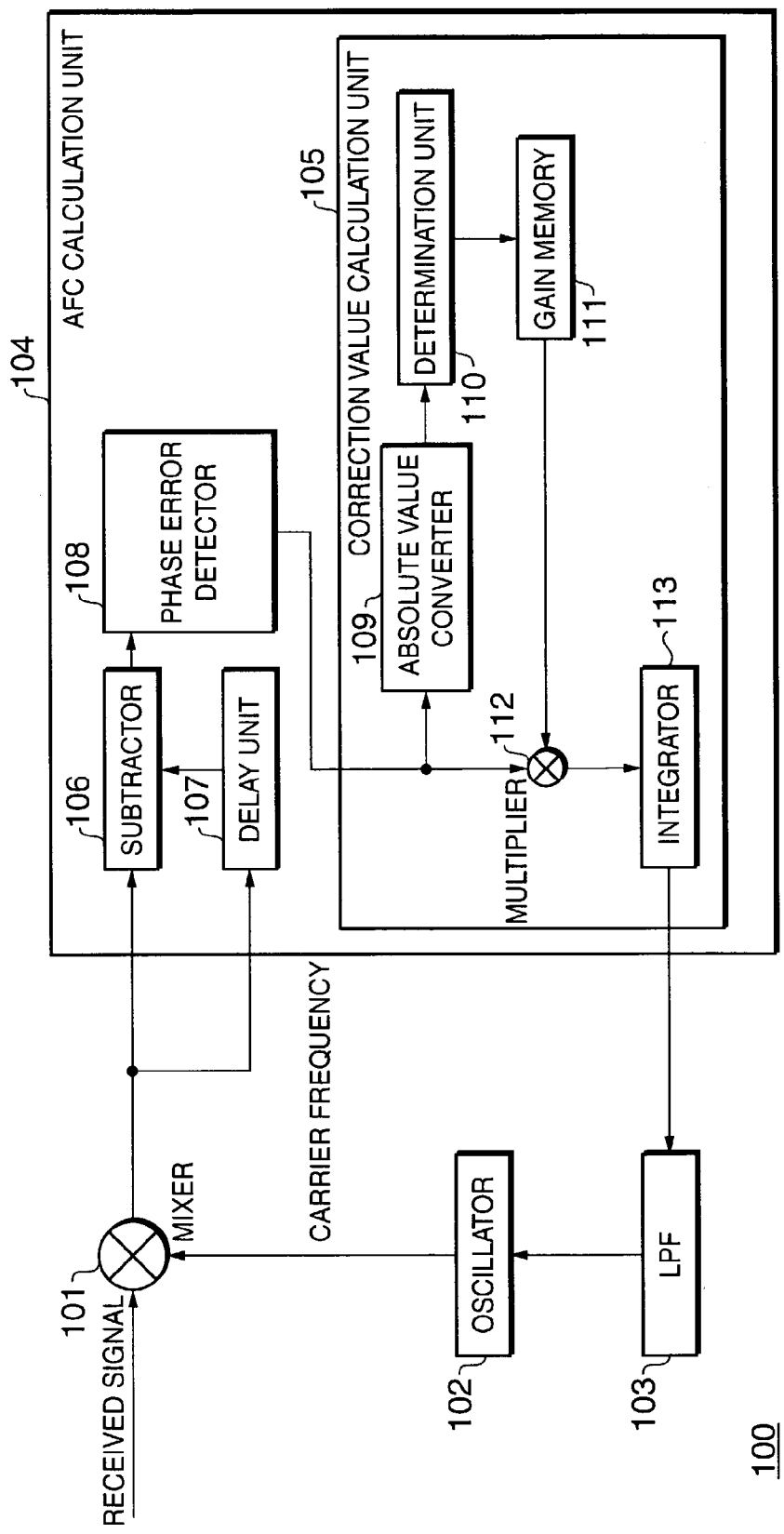
FIG. 1 is a block diagram showing the internal configuration of an automatic frequency control apparatus according to a first embodiment of the present invention.

FIG. 1 is a block diagram showing the internal configuration of the automatic frequency control apparatus according to the first embodiment of the present invention.

As is shown in FIG. 1, an automatic frequency control apparatus 100 comprises a mixer 101, an oscillator 102, an LPF 103 and an automatic frequency control (AFC) calculation unit 104.

The mixer 101 receives a phase modulated signal and performs a frequency alteration based on the frequency (hereinafter referred to as a carrier frequency) of a carrier wave that is generated by the oscillator 102. Thereafter, the mixer 101 transmits the signal obtained by the frequency alteration to the automatic frequency control calculation unit 104.

The oscillator 102 receives, through the LPF 103, a correction value for correcting a carrier frequency, corrects the carrier frequency based on the correction value, and outputs the resultant carrier to the mixer 101.

The automatic frequency control (AC) calculation unit 104 receives from the mixer 101 the signal obtained by the frequency alteration, calculates a correction value for a frequency error, and transmits the correction value to the LPF 103. The automatic frequency control calculation unit 104 includes a subtractor 106, a delay unit 107, a phase error detector 108 and a correction value calculation unit 105. The correction value calculation unit 105 includes an absolute value converter 109, a determination unit 110, a gain memory 111, a multiplier 112 and an integrator 112.

The delay unit 107 receives a frequency-altered signal from the mixer 101, and transmits the received signal to the subtractor 106 following a predetermined symbol interval delay. The delay unit 107 is a conventional delay unit that generally delays the frequency-converted signal for one symbol interval. In this embodiment, so long as a phase error can be detected, the delay interval is not especially specified.

The subtractor 106 receives a frequency-altered signal from the mixer 101 and a delayed signal from the delay unit 107, calculates a difference between these two signals, and transmits the difference to the phase error detector 108.

The phase error detector 108 receives the calculation results from the automatic frequency control calculation unit 106, obtains a carrier phase error (phase error) by removing the phase modulation element from the calculation results, and transmits the phase error to the correction value calculation unit 105.

In the correction value calculation unit 105, the absolute value converter 109 receives and calculates an absolute value for the phase error, and transmits the absolute value to the determination unit 110. That is, the absolute value converter 109 converts into a phase error value, which disregards the advance or delay of the phase, a phase error for which an advance or a delay of the phase is represented by a positive or negative value. Therefore, the absolute value converter 109 may not only obtain the absolute value for the phase error, but may also, as an example, square the phase error.

The determination unit 110 receives the absolute value of the phase error from the absolute value converter 109, compares the absolute value with multiple threshold values that have previously been designated, and based on the comparison results, selects and instructs the output of a loop gain obtained from the gain memory 111. In other words, in accordance with the absolute value of the error phase, the determination unit 110 selects and instructs the employment of a loop gain stored in the gain memory 111.

The gain memory 111 is used to store in advance loop gains that correspond to multiple threshold values designated by the determination unit 110, and in accordance with an instruction received from the determination unit 110, the loop gain is extracted from the gain memory 111 and transmitted to the multiplier 112. Therefore, when two threshold values are designated in advance for the determination unit 110, three loop gains are stored in the gain memory 111.

The multiplier 112 receives the phase error from the phase error detector 108, and the loop gain obtained from the gain memory 111, multiplies the loop gain by the phase error, and transmits a correction value, i.e., the frequency control data, to the integrator 113.

The integrator 113 receives the correction value from the multiplier 112, smoothes the correction value, and transmits the obtained value through the LPF 103 to the oscillator 102.

The frequency of the signal obtained by the digital phase modulation is altered by the mixer 101 based on the frequency of the carrier that is locally oscillated, and the resultant signal is transmitted to the automatic frequency control calculation unit 104.

Figure 2:
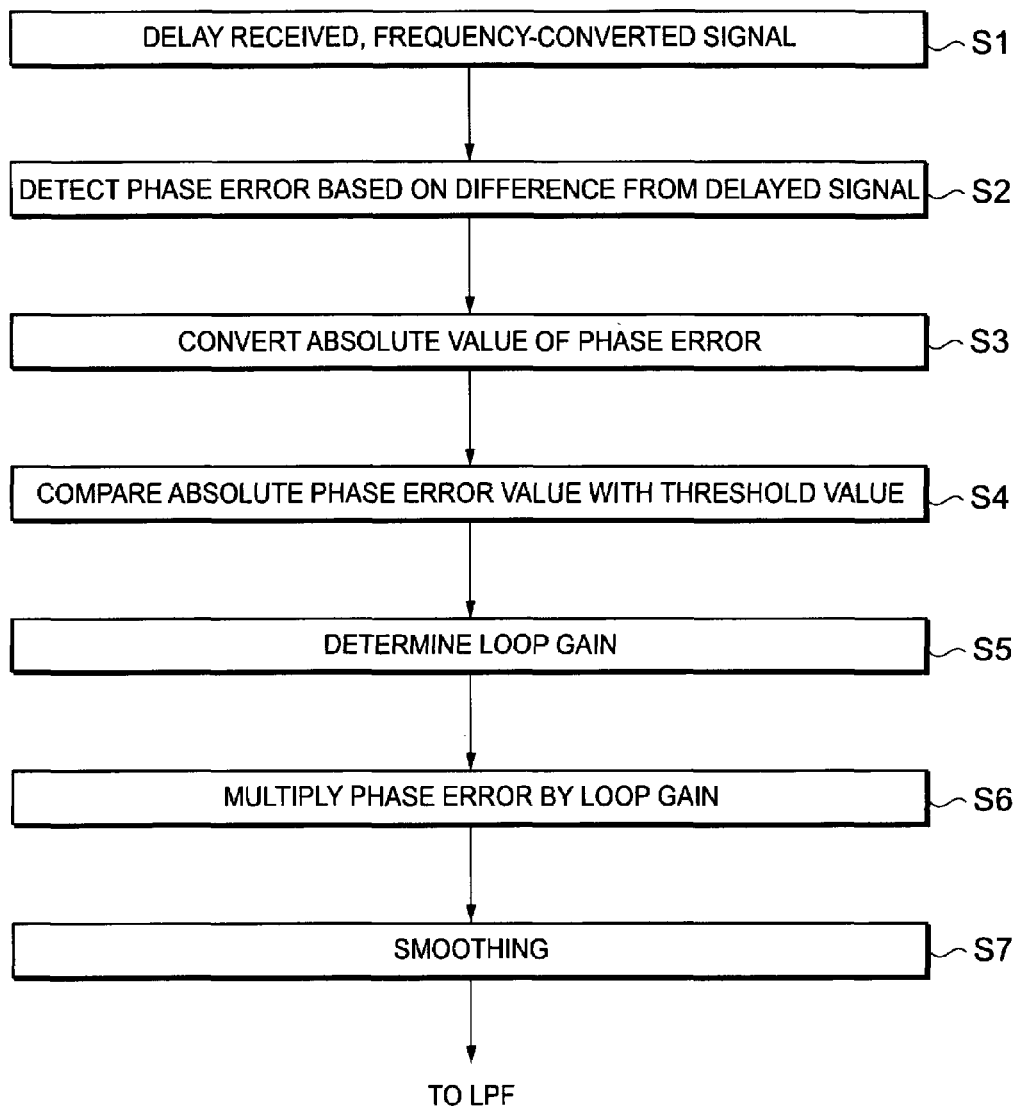
FIG. 2 is a flowchart showing the operation of an automatic frequency calculator according to the embodiment of the invention.

FIG. 2 is a flowchart showing the correction value calculation processing performed by the automatic frequency control calculation unit 104.

The delay unit 107 delays the frequency-altered signal a predetermined symbol interval, and transmits the resultant signal to the subtractor 106, whereat a difference between the frequency-converted signal and the delayed signal (S1) is calculated.

The phase error detector 108 detects the carrier frequency phase error (phase error) in the calculation results obtained by the subtractor 106 (S2).

The absolute value converter 109 converts, into an absolute value, the phase error detected by the phase error detector 108, and transmits the absolute value to the determination unit 110 (S3).

The determination unit 110 compares the phase error absolute value, obtained by the absolute value converter 109, with the threshold values that have been designated in advance, and selects and instructs the employment of a loop gain that is consonant with the phase error absolute value (S4).

The loop gain, determined based on an instruction received from the determination unit 110, is stored in the gain memory 111 and is transmitted to the multiplier 112 (S5).

When, for example, two threshold values are designated by the determination unit 110, three loop gains, a large, a small and an intermediate loop gain, are stored in the gain memory 111. The determination unit 110 then compares the phase error absolute value with these threshold values to determine the magnitude of the phase error absolute value. When the phase error absolute value exceeds that of the high threshold value, the high loop gain is selected and its use is instructed. When the phase error absolute value is smaller than the small threshold value, the small loop gain is selected and its use is instructed. And when the phase error absolute value lies between the two threshold values, i.e., when the phase error absolute value is comparatively small and does not reach the stable range, the intermediate lop gain is selected and its use is instructed. Of course, the setup of the threshold values and the number of threshold values are not limited to those used for this embodiment.

The multiplier 112 multiplies the loop gain extracted from the gain memory 111 by the phase error obtained by the phase error detector 108, and generates a correction value for the carrier frequency (S6).

The integrator 113 smoothes the correction value for the frequency error, and transmits the correction value through the LPF 103 to the oscillator 102 (S7). The oscillator 102 employs the correction value for the frequency error for the oscillation of the carrier wave at the corrected frequency.

By repeating the above processing, the loop gain to be multiplied by the phase error can be adjusted based on the magnitude of the absolute value of the phase error, and a frequency error can be corrected in accordance with the transfer conditions.

According to the first embodiment, since the loop gain can be determined in accordance with the phase error absolute value obtained by the absolute value converter 109, compared with the conventional example, for which the loop gain is changed in a time-transient manner, the frequency error can be corrected in accordance with a change in the transfer state during the demodulation of the received signal.

An automatic frequency control apparatus according to a second embodiment of the present invention will now be described while referring to FIG. 3.

In the second embodiment, to correct a frequency error the magnitude of the phase error is determined based on the position detected for the most significant bit (MSB) of the phase error absolute value, and the phase error is shifted a distance equivalent to a shift value that is consonant with the magnitude of the phase error.

Figure 3:
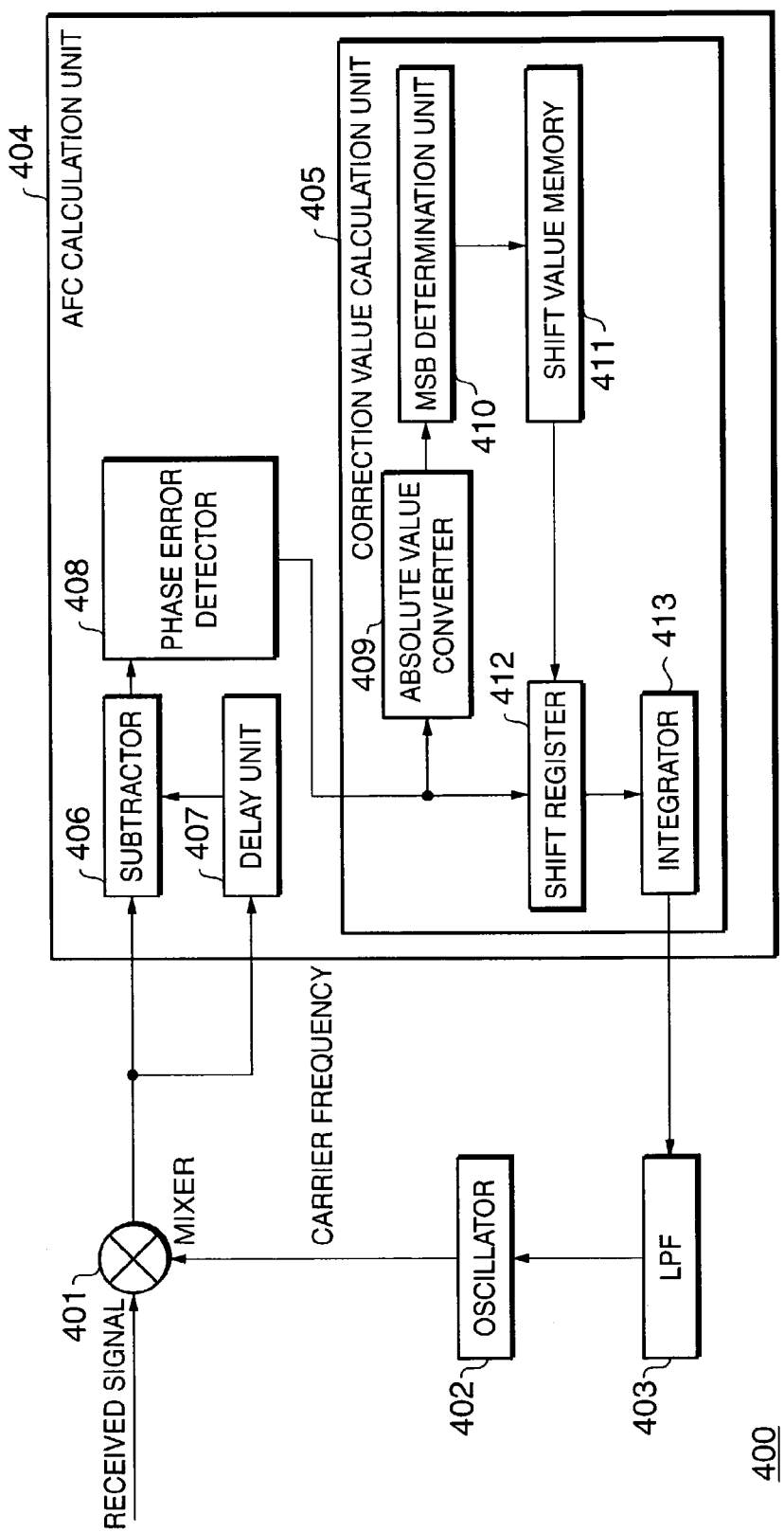
FIG. 3 is a block diagram showing the internal configuration of an automatic frequency control apparatus according to a second embodiment of the present invention.

FIG. 3 is a block diagram showing the internal configuration of the automatic frequency control apparatus according to the second embodiment. An automatic frequency control apparatus 400 in the second embodiment differs from that of the first embodiment in the structure of a correction value calculation unit 405. Only the arrangement of the correction value calculation unit 405 will now be described in detail; no explanation will be given for components other than the correction value calculation unit 405. The same reference numerals as are used in the first embodiment are used in the second embodiment to denote corresponding components.

The correction value calculation unit 405 includes an absolute value converter 409, an MSB determination unit 410, a shift value memory 411, a shift register 412, and an integrator 413.

The absolute value converter 409 receives a phase error from the phase error detector 408, converts the phase error into an absolute value, and transmits the phase error absolute value to the MSB determination unit 410.

The MSB determination unit 410 receives the phase error absolute value from the absolute value converter 409, and based on the detected position of the MSB of the phase error absolute value that is received, determines the magnitude of the phase error. The MSB determination unit 410 then transmits the magnitude of the phase error to the shift value memory 411. That is, by using the detected position of the MSB as a reference, the MSB determination unit 410 determines whether the phase is advanced or delayed, and selects and instructs the use of the shift value that is stored in the shift value memory 411 and that disregards the advance or delay of the phase. Therefore, in consonance with the transfer change, the magnitude of the phase error can be determined by the MSB determination unit 410.

The shift value memory 411 is used to store multiple shift values that are designated in advance for shifting the phase error, and in accordance with the instruction from the MSB determination unit 410, a shift value consonant with the phase error is transmitted to the shift register 412.

The shift register 412 receives the phase error from the phase error detector 408 and the shift value from the shift memory 411, and shifts the phase error a distance equivalent to the shift value. That is, the shift register 412 performs the same functions as a multiplication circuit for the power of 2. It should be noted that the process for determining the shift value is the equivalent of the process performed by the shift register 412.

The correction value calculation process performed by the correction value calculation unit 405 will now be described.

The phase error detector 408 transmits the detected phase error to the absolute value converter 409 and the shift register 412. And the absolute value converter 409 converts the received phase error into an absolute value and transmits the absolute value to the MSB determination unit 410.

The MSB determination unit 410 detects the position of the MSB of the phase error absolute value received from the absolute value converter 409, determines the magnitude of the phase error based on the detected position of the MSB, and transmits the magnitude of the phase error to the shift value memory 411.

In accordance with the magnitude of the phase error determined by the MS determination unit 410, the shift value is extracted from the shift value memory 411 and transmitted to the shift register 412.

The shift register 412 shifts the phase error received from the phase error detector 408 a distance equivalent to the shift value extracted from the shift value memory 411, and obtains a correction value for correcting the frequency error.

According to the second embodiment, the same effects can be acquired as are obtained in the first embodiment.

Further, according to the second embodiment, since the MSB determination unit 410 and the shift value memory 411 are provided, a shift value consonant with the magnitude of the phase error can be obtained, and the circuit size reduced and simplified, by using as a reference the detected position of the MSB of the absolute value of the phase error.

An automatic frequency control apparatus according to a third embodiment of the present invention will now be described in detail while referring to FIGS. 4 and 5.

According to the third embodiment, while taking into account the loop delay related to the automatic frequency control, a function, based on a phase angle difference between a current and a preceding phase, for adjusting a loop gain and correcting a frequency error is provided for the configuration of the first embodiment.

As one problem, even when a phase error is gradually reduced following the start of the initial synchronization, and the output of an integrator near the output side of a correction value calculation unit has reached an optimal correction value, a delay occurs that continues until the correction value is reflected, so that the phase can be shifted without the exact correction value being reflected. The feature of the third embodiment is the provision of a function that resolves this problem.

Figure 4:
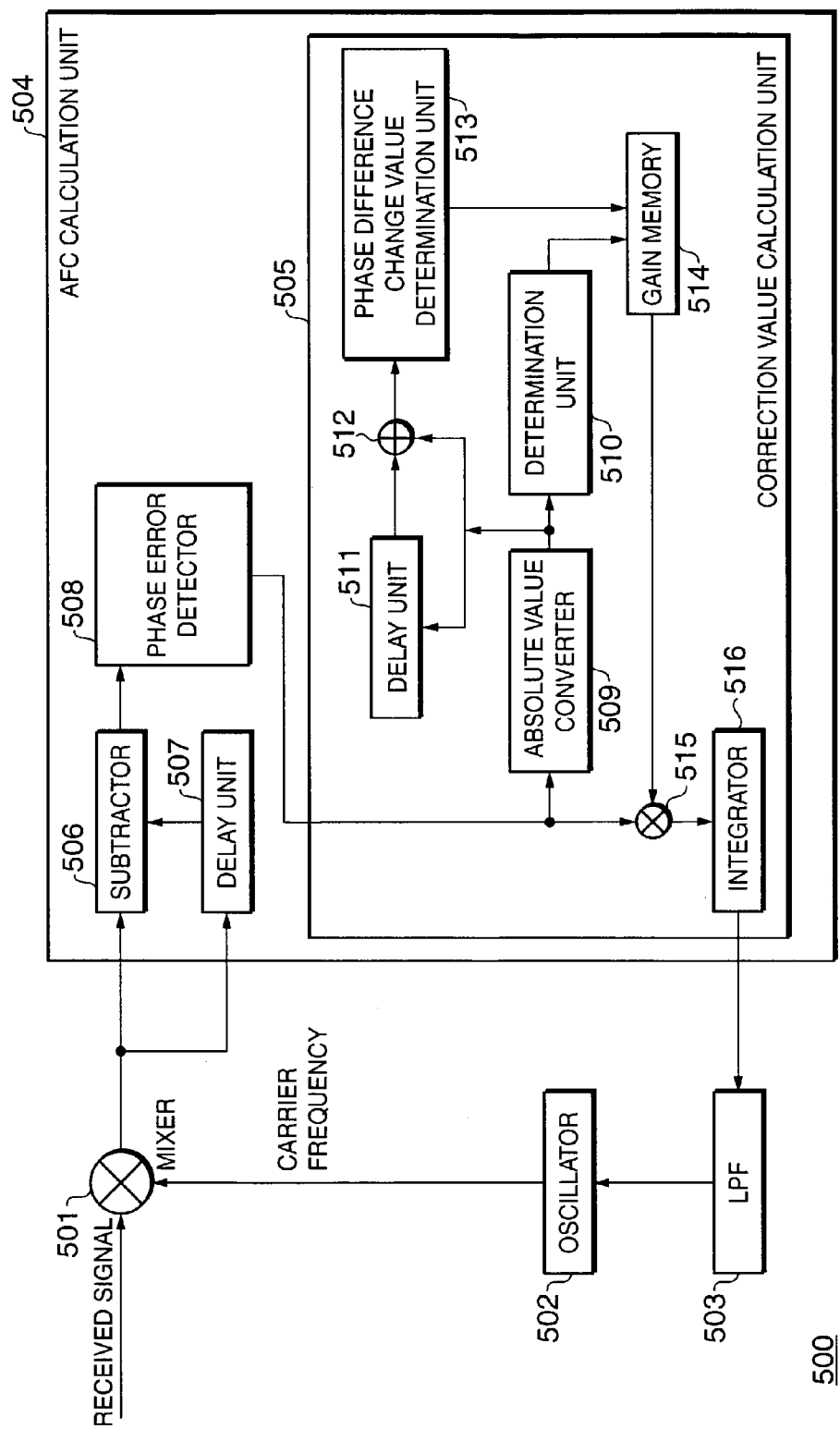
FIG. 4 is a block diagram showing the internal configuration of an automatic frequency control apparatus according to a third embodiment of the present invention.
Figure 5:
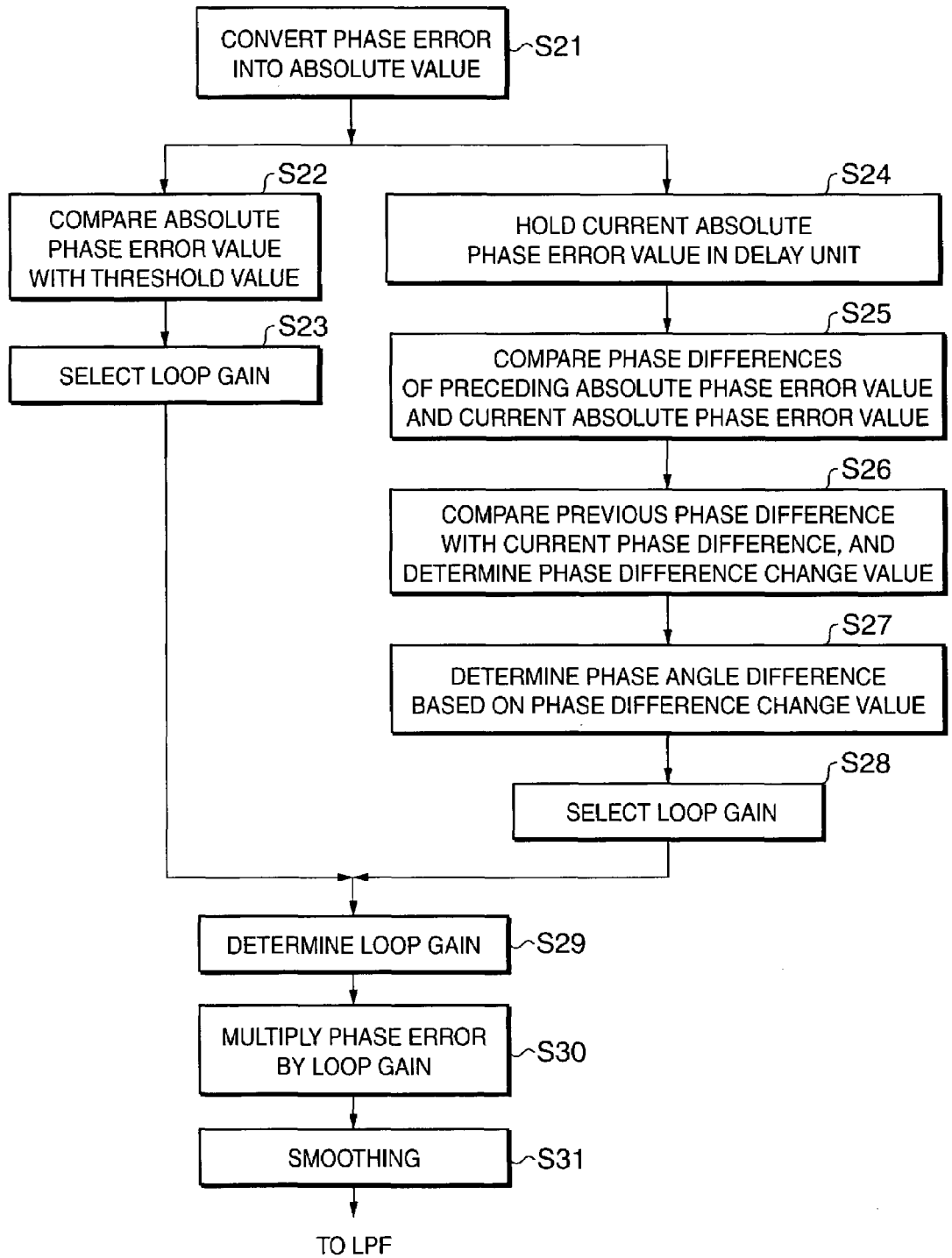
FIG. 5 is a flowchart showing the operation of the correction value calculator according to the third embodiment of the invention.

FIG. 4 is a block diagram showing the internal configuration of the automatic frequency control apparatus according to the third embodiment. The same reference numerals as are used for the first embodiment are employed to denote corresponding components in the third embodiment, and no further explanation of their functions will be given.

As is shown in FIG. 4, according to an automatic frequency control apparatus 500 for the third embodiment, an automatic frequency control (AFC) calculation unit 504 includes a subtractor 506, a delay unit 507, a phase error detector 508 and a correction value calculation unit 505. The correction value calculation unit 505 further includes an absolute value converter 509, a determination unit 510, a delay unit 511, a subtractor 512, a phase difference change value determination unit 513, a gain memory 514, a multiplier 515 and an integrator 516. In the third embodiment, a phase error provided by the phase error detector 508 for the correction value calculation unit 505 is represented by $\sin \theta$. It should be noted that $\theta$ denotes the phase angle difference between a current phase and a preceding phase.

The delay unit 511 receives from the absolute value converter 509 an absolute phase error value that it holds temporarily. Further, upon receiving the current absolute phase error value, the delay unit 511 transmits to the subtractor 512 a preceding absolute phase error value that is held internally.

The subtractor 512 receives the current absolute phase error value from the absolute value converter 509 and the preceding absolute phase error value from the delay unit 511, and calculates a phase difference based on the current absolute phase error value and the preceding absolute phase error value. The subtractor 512 then transmits the obtained phase difference to the phase difference change value determination unit 513. It should be noted that the phase difference is the difference between the two absolute phase error values.

Thereafter, the phase difference change value determination unit 513 receives the phase difference from the subtractor 512 and employs the change value of the phase difference to select and instruct the use of a loop gain stored in the gain memory 514. That is, the phase difference change value determination unit 513 compares the currently received phase difference with a previously received phase difference, determines the phase angle difference, based on the difference in the change values of the phase differences, and selects and instructs the use of the loop gain. As the reason for this, since the frequency does not always converge when only the phase difference is reduced, the phase angle difference must be considered, and even when it is sin θ, the phase angle difference θ will be θθ<π/2 or θ>π/2. Specifically, assume that synchronization begins at the time of the initial phase error. Then, when the phase angle difference θ is greater than π/2, the phase error is increased until the phase angle difference θ is π/2, and when the phase angle difference θ is equal to or smaller than π/2, it is reduced. It should be noted that the phase difference sin θ, wherein θ=π/2, is the greatest, and the phase difference sin θ, wherein θ=0 or π, is the smallest. When the phase difference change value is increased during the frequency control process, the phase difference change value determination unit 513 ascertains that the phase angle difference θ is greater than π/2. And when the phase difference change value is reduced, the phase difference change value determination unit 513 ascertains that the phase angle difference θ is smaller than π/2. Therefore, when the phase difference change value determination unit 513 ascertains that the phase difference angle θ is greater than π/2, the determination unit 513 selects and instructs the use of a high loop gain. And when the phase difference change value determination unit 513 ascertains that the phase difference angle θ is smaller than π/2, the determination unit 513 selects and instructs the use of a low loop gain to suppress the vibration due to the loop delay.

The gain memory 514 is used to store multiple loop gains, and a loop gain, selected or instructed for use by the determination unit 510, and the phase difference change value determination unit 513 are output. Therefore, the loop gain is determined based not only on the magnitude of the absolute phase error value in the first embodiment, but also on the phase difference change value. The loop gain stored in the gain memory 514 corresponds to an absolute phase error value, for example, and can cope with a case wherein the phase angle difference is large and one wherein it is small.

The operation of the correction value calculation unit 505 according to the third embodiment will now be explained while referring to FIG. 5. FIG. 5 is a flowchart showing the operation of the correction value calculation unit 505.

The phase error detector 508 detects a phase error in a frequency-altered signal received from the mixer 501, and transmits the phase error to the correction value calculation unit 505.

The absolute value converter 509 of the correction value calculation unit 505 converts into an absolute value the phase error received from the phase error detector 508 (S21).

The absolute value converter 509 transmits the absolute phase error value to the determination unit 510, the delay unit 511 and the subtractor 512. The determination unit 510 compares the absolute phase error value with the threshold value that has been set in advance, and selects a loop gain that is consonant with the absolute phase error value (S22 and S23).

The delay unit 511 holds the current absolute phase error value received from the absolute value converter 509 (S24), and transmits to the subtractor 512 the preceding absolute phase error value that it was holding.

The subtractor 512 compares with the preceding absolute phase error value, received from the delay unit 511, the current absolute phase error value, received from the absolute value converter 509, and obtains the phase difference (S25). The phase difference is then transmitted to the phase difference change value determination unit 513.

The phase difference change value determination unit 513, to determine whether the change value for the phase difference has been increased or decreased, calculates a change value between the previously received phase difference and the currently received phase difference (S26), and then employs the difference in the change value of the phase difference to determine the phase angle difference (S27).

That is, the phase difference change value determination unit 513 determines whether the change value between the previous phase difference and the current phase difference has been increased or reduced. Then, when it is determined that during the frequency control process the change value of the phase difference has been increased, it is ascertained that the phase difference angle is greater than π/2, while when it is determined that the change value of the phase difference has been decreased, it is ascertained that the phase difference angle is smaller than π/2.

After making the phase angle difference determination, the phase difference change value determination unit 513 selects a corresponding loop gain stored in the gain memory 514 (S29).

According to the third embodiment described above, since the phase difference change value determination unit 513 is provided, the value for the correction of the frequency of a carrier for which local oscillation is provided can be correlated, in phase with a corresponding phase error. Therefore, the time required for the convergence at a desired frequency can be reduced for the carrier for which local oscillation is provided.

The appropriate loop gain selected by the determination unit 510 and the phase difference change value determination unit 513 is extracted from the gain memory 514 and output to the multiplier 515. The multiplier 515 then multiplies the loop gain by the phase error, and the resultant value is smoothed. Thereafter, the obtained correction value is output to the LPF 503 (S30 and S31).

Furthermore, according to the third embodiment, since the phase difference change value determination unit 513 is additionally provided for the configuration in the first embodiment, the loop gain can be determined not only in accordance with the phase error, but also in accordance with the phase angle difference. Thus, the frequency error can be corrected in accordance with the change in the transmission condition.

According to the first to third embodiments, a received signal has been employed as a signal obtained through digital phase modulation. Specifically, any signal obtained through digital phase modulation, such as a BPSK modulation or a QPSK modulation, can be employed. Further, since the configurations used for the above embodiments can be applied for a demodulation circuit that can correct the frequency of a carrier for which local oscillation is provided, a signal obtained using digital frequency modulation can also be employed.

According to the present invention, the automatic frequency control apparatus comprises:

correction value calculation means for calculating a correction value based on a loop gain and a carrier phase error between a carrier frequency and a received signal, obtained through digital phase modulation or digital frequency modulation, wherein the correction value obtained from the correction value calculation means is employed to control the frequency of a carrier for which local oscillation is provided, wherein the correction value calculation means includes
a phase error value converter for converting the carrier phase error of the received signal into a phase error value that disregards the advance or the delay of a phase,
a loop gain determination unit for determining a loop gain in accordance with the magnitude of the phase error value obtained by the phase error value converter, and
a correction value calculator for calculating a correction value by multiplying the carrier phase error of the received signal by the loop gain that is determined by the loop gain determination unit. With this configuration, since the loop gain can be determined in accordance with the magnitude of the phase error, the frequency error for a carrier can be corrected in accordance with a change in the transmission condition.

What is claimed is:

1. An automatic frequency control apparatus comprising:
a mixer performing a frequency alternation of a phase modulated signal received thereto based on a frequency of a carrier signal;
a phase error detector coupled to the mixer, the phase error detector generating a carrier phase error;
an absolute value converter coupled to the phase error detector, the absolute value converter calculating an absolute value of the phase error;
a determination unit coupled to the absolute value converter, the determination unit comparing the absolute value with a plurality of predetermined threshold values and generating loop gain based on the comparison;
a multiplier coupled to the phase error detector and the determination unit, the multiplier generating a correction value based on the phase error and the loop gain; and
an oscillator coupled to the multiplier and the mixer, the oscillator generating the carrier signal based on the correction value.

2. An automatic frequency control apparatus according to claim 1, wherein the phase error detector includes
a delay unit coupled to the mixer, the delay unit transmit the phase modulated signal with a predetermined symbol interval delay;
a subtractor coupled to the mixer and the delay unit, the subtractor calculating a difference between the phase modulated signal from the mixer and the delayed phase modulated signal from the delay unit; and
a phase error detecting circuit coupled to the subtractor, the phase error detecting circuit generating the carrier phase error based on the difference from the subtractor.

3. An automatic frequency control apparatus according to claim 1, further comprising
an integrator coupled to the multiplier, the integrator smoothing the correction value received from the multiplier; and
a low pass filter coupled to the integrator and the oscillator.

4. An automatic frequency control apparatus according to claim 1, further comprising a gain memory coupled to the determination unit and the multiplier, the gain memory storing the loop gain.

5. An automatic frequency control apparatus according to claim 4, wherein the gain memory stores a plurality of loop gains corresponding to the threshold values.

6. An automatic frequency control apparatus according to claim 5, further comprising
a delay unit coupled to the absolute value converter;
a subtractor coupled to the delay unit and the absolute value converter, the subtractor calculating a phase difference between the absolute value from the absolute value converter and the delayed absolute value from the delay unit; and
a phase difference change value determination unit coupled to the subtractor and gain memory, the phase difference change value determination unit instructing the gain memory so as to output one of the loop gains based on the phase difference from the subtractor.

7. An automatic frequency control apparatus comprising:
a mixer performing a frequency alternation of a phase modulated signal received thereto based on a frequency of a carrier signal;
a phase error detector coupled to the mixer, the phase error detector generating a carrier phase error;
an absolute value converter coupled to the phase error detector, the absolute value converter calculating an absolute value of the phase error;
an MSB determination unit coupled to the absolute value converter, the MSB determination unit determining a magnitude of the phase error based on the MSB of the absolute value;
a shift value memory coupled to the MSB determination unit, the shift value memory storing a plurality of shift values and outputting one of the shift values in response to the magnitude from the MSB determination unit;
a shift register coupled to the phase error detector and the shift value memory, the shift register shifting the phase error based on the shift value from the shift value memory; and
an oscillator coupled to the shift register and the mixer, the oscillator generating the carrier signal based on the shifted phase error.

8. An automatic frequency control apparatus according to claim 7, wherein the phase error detector includes
a delay unit coupled to the mixer, the delay unit transmit the phase modulated signal with a predetermined symbol interval delay;
a subtractor coupled to the mixer and the delay unit, the subtractor calculating a difference between the phase modulated signal from the mixer and the delayed phase modulated signal from the delay unit; and a phase error detecting circuit coupled to the subtractor, the phase error detecting circuit generating the carrier phase error based on the difference from the subtractor.

9. An automatic frequency control apparatus according to claim 7, further comprising an integrator coupled to the multiplier, the integrator smoothing the correction value received from the multiplier; and a low pass filter coupled to the integrator and the oscillator.

10. An automatic frequency control apparatus comprising:

correction value calculation unit calculating a correction value based on a loop gain and a carrier phase error between a carrier frequency and a received signal, obtained through digital phase modulation or digital frequency modulation;

wherein the correction value obtained from said correction value calculation unit is employed to control the frequency of a carrier for which local oscillation is provided;

wherein the correction value calculation unit includes a phase error value converter converting the carrier phase error of the received signal into a phase error value that disregards the advance or the delay of a phase;

a loop gain determination unit determining a loop gain in accordance with the magnitude of the phase error value obtained by the phase error value converter, the loop gain determination unit including a delay unit temporarily holding said phase error value received from the phase error value converter, and outputting, upon the reception of the phase error value from the phase error value converter, a preceding, previously received phase error value, a phase difference calculation unit calculating a chase difference between the phase error value received from the phase error value converter and the preceding phase error value, and a phase angle difference determination unit receiving the phase difference from the phase difference calculation unit, employing a value for a phase difference change between the phase difference and the preceding phase difference to determine a phase angle difference for the current phase and the previous phase, and determining a loon gain in accordance with the phase angle difference; and a correction value calculator calculating a correction value by multiplying the carrier phase error of the received signal by said loop gain that is determined by the loop gain determination unit.

11. An automatic frequency control apparatus according to claim 10, wherein the phase angle difference determination unit determines a loop gain is high when the phase angle difference is large, or determines a loop gain is low when the phase angle difference is small.

* * * * *